US012614595B2

(12) United States Patent
Hung

(10) Patent No.: US 12,614,595 B2
(45) Date of Patent: Apr. 28, 2026

(54) MEMORY SENSING WITH GLOBAL COUNTER

(71) Applicant: MACRONIX INTERNATIONAL CO., LTD., Hsinchu (TW)

(72) Inventor: Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 341 days.

(21) Appl. No.: 18/380,052

(22) Filed: Oct. 13, 2023

(65) Prior Publication Data

US 2025/0124988 A1 Apr. 17, 2025

(51) Int. Cl.
G11C 16/28 (2006.01)

(52) U.S. Cl.
CPC .................................... G11C 16/28 (2013.01)

(58) Field of Classification Search
CPC ...................................................... G11C 16/28
USPC .................................................... 365/185.21
See application file for complete search history.

(56) References Cited

U.S. PATENT DOCUMENTS

| | | | | |
|---|---|---|---|---|
| 5,913,878 | A | * | 6/1999 | Hsung .................. A61N 1/3622 |
| | | | | 607/5 |
| 7,057,939 | B2 | | 6/2006 | Li et al. |
| 8,891,293 | B2 | | 11/2014 | Du et al. |
| 9,099,181 | B2 | | 8/2015 | Ong |
| 9,646,692 | B1 | | 5/2017 | Lung et al. |
| 10,635,398 | B2 | | 4/2020 | Lin et al. |
| 10,741,242 | B2 | | 8/2020 | Seo et al. |
| 10,777,566 | B2 | | 9/2020 | Lue |
| 10,957,392 | B2 | | 3/2021 | Lee et al. |
| 11,132,176 | B2 | | 9/2021 | Hung et al. |
| 11,138,497 | B2 | | 10/2021 | Lin et al. |
| 11,237,766 | B2 | | 2/2022 | Seong et al. |
| 11,315,009 | B2 | | 4/2022 | Buchanan et al. |
| 12,354,672 | B2 | * | 7/2025 | Hung .................. G11C 11/5642 |
| 2003/0090934 | A1 | | 5/2003 | Iwata |

(Continued)

FOREIGN PATENT DOCUMENTS

| | | |
|---|---|---|
| CN | 104051023 A | 9/2014 |
| EP | 2057633 B1 | 3/2013 |

(Continued)

OTHER PUBLICATIONS

U.S. Appl. No. 18/109,455, filed Feb. 14, 2023, 29 pages.

*Primary Examiner* — Amir Zarabian
*Assistant Examiner* — Daniel John King
(74) *Attorney, Agent, or Firm* — Andrew L. Dunlap; Haynes Beffel & Wolfeld LLP

(57) ABSTRACT

A circuit is provided. The circuit includes an array of memory cells including a plurality of bit lines and a plurality of word lines, sensing circuits configured to sense a difference between first and second currents on respective bit lines in selected bit lines and to produce outputs for the selected bit lines as a function of the difference, and a global counter configured to continuously provide a count value to each of the sensing circuits in dependence on a clock signal. Each sensing circuit, of the sensing circuits, can produce an output in dependence on (i) the difference between the first and second currents and (ii) a stored count value received from the global counter, the count value being stored in dependence on a value of the difference between the first and second currents.

20 Claims, 5 Drawing Sheets

(56)          References Cited

U.S. PATENT DOCUMENTS

| | | | |
|---|---|---|---|
| 2008/0031043 A1 | 2/2008 | Aochi et al. | |
| 2019/0019560 A1* | 1/2019 | Jeong | G11C 11/417 |
| 2019/0287603 A1 | 9/2019 | Antonyan et al. | |
| 2019/0348097 A1 | 11/2019 | Karmakar et al. | |
| 2022/0295003 A1* | 9/2022 | Lee | H04N 25/79 |

FOREIGN PATENT DOCUMENTS

| | | | |
|---|---|---|---|
| TW | 253057 | B | 8/1995 |
| TW | 200620284 | A | 6/2006 |
| TW | 201212026 | A | 3/2012 |
| TW | 201301286 | A | 1/2013 |
| TW | I457923 | B | 10/2014 |
| TW | 201735037 | A | 10/2017 |
| TW | 201933361 | A | 8/2019 |
| TW | I764104 | B | 5/2022 |

* cited by examiner

MEMORY SENSING WITH GLOBAL COUNTER

BACKGROUND

Field

The present disclosure relates to memory sensors (e.g., sensing circuits of a memory) that use a global counter. More specifically, the present disclosure relates to in-memory computing for performing compute in memory (CIM) operations that implement memory sensors that share a global counter, as opposed to each memory sensor having a local analog-to-digital converter.

Description of Related Art

Conventional in-memory computing components that perform CIM operations implement thousands of individual sensors (e.g., local sensing circuits) to detect analog current and/or voltage on bit lines of a memory array. The local sensing circuits can add or subtract currents that are sensed across pairs of selected bit lines. For example, the local sensing circuits can add two currents detected on two bit lines and/or can subtract one current from another current, as detected on the two bit lines, to provide an analog output current value. The local sensing circuit can further convert, using a local analog-to-digital converter (ADC), the analog output value to a digital signal that can be used by other portions of the in-memory computing components. More specifically, each individual local sensing circuit can include (i) a current/voltage manipulator to detect the difference between the currents/voltages (e.g., addition or subtraction of current/voltage values) on the pair of selected bit lines to provide an analog current or voltage measurement, (ii) an analog-to-digital converter (ADC) to convert the analog measurement to a digital signal and (iii) storage, such as latches or flip-flops to store the output of the analog-to-digital converter and provide a data output.

The physical size and the power consumption of components within these in-memory computing devices can make it difficult to provide smaller and more efficient electronic devices. The conventional use of a local analog-to-digital converter (ADC) in each local sensing circuit of the in-memory computing device causes the in-memory computing device to consume an undesirable amount of power and to occupy an undesirable amount of space, as the analog-to-digital converters (ADC) can occupy a majority of the physical space and can consume a majority of the power required by the sensing circuits.

Therefore, it is desirable to provide local sensing circuits of in-memory computing devices, or other types of computing devices, that occupy less physical space and that are more power efficient.

SUMMARY

The present invention provides a circuit and a method for sensing currents in bit lines of an array of memory cells.

The circuit can include an array of memory cells including a plurality of bit lines and a plurality of word lines, sensing circuits configured to sense a difference between first and second currents on respective bit lines in selected bit lines and to produce outputs for the selected bit lines as a function of the difference, and a global counter configured to continuously provide a count value to each of the sensing circuits in dependence on a clock signal. Each sensing circuit, of the sensing circuits, can produce an output in dependence on (i) the difference between the first and second currents and (ii) a stored count value received from the global counter, the count value being stored in dependence on a value of the difference between the first and second currents.

In an embodiment, the global counter can be configured to continuously increment or decrement the count value over time. For a particular time, a same particular count value can be provided to each of the sensing circuits.

In another embodiment, each sensing circuit, of the sensing circuits, can include a local detector circuit configured to receive a detected voltage ($V_c$) generated in dependence on the difference, receive a reference voltage ($V_{ref}$), and generate a trigger signal in dependence on the detected voltage ($V_c$) and the reference voltage ($V_{ref}$).

In a further embodiment, each sensing circuit, of the sensing circuits, can include a storage configured to store a particular count value provided by the global counter, and the storing of the particular count value can be performed in dependence on the trigger signal.

In an embodiment the storage can include latches that store the particular count value provided by the global counter.

In another embodiment, the storage can include flip-flops that store the particular count value provided by the global counter.

In a further embodiment, the local detector circuit can include a comparator configured to (i) compare the detected voltage ($V_c$) and the reference voltage ($V_{ref}$) and (ii) generate the trigger signal as a result of the detected voltage ($V_c$) reaching, exceeding or falling below the reference voltage ($V_{ref}$).

In a further embodiment, the trigger signal generated by the comparator can be edge triggered as the result of the detected voltage ($V_c$) reaching, exceeding or falling below the reference voltage ($V_{ref}$).

In an embodiment, the trigger signal generated by the comparator can be level triggered as the result of the detected voltage ($V_c$) reaching or exceeding the reference voltage ($V_{ref}$).

In another embodiment, the local detector circuit can include a differential amplifier configured to generate the trigger signal in dependence on the detected voltage ($V_c$) and the reference voltage ($V_{ref}$).

In a further embodiment, the local detector circuit can include an inverter configured to generate the trigger signal in dependence on the detected voltage ($V_c$) and the reference voltage ($V_{ref}$).

In an embodiment the reference voltage ($V_{ref}$) can be received by each sensing circuit, of the sensing circuits, from a global fixed reference voltage source, such that each sensing circuit receives the same reference voltage ($V_{ref}$).

In another embodiment, the reference voltage ($V_{ref}$) can be received by each sensing circuit, of the sensing circuits, from a global adjustable reference voltage source, such that each sensing circuit receives the same reference voltage ($V_{ref}$).

In a further embodiment each sensing circuit, of the sensing circuits, can operate according to the same global counter and the local detector circuit, as opposed to implementing a local analog-to-digital converter.

In an embodiment each sensing circuit, of the sensing circuits, does not include a local analog-to-digital converter.

In another embodiment the count value provided by the global counter can be a binary value of at least two bits.

In a further embodiment the global counter can be one of a regular counter and a non-regular counter.

In an embodiment, each sensing circuit, of the sensing circuits, can include a current manipulator circuit configured to sense a difference between a first sensed current ($I_0$) and a second sensed current ($I_1$) and to output a current ($I_{cell}$), and a capacitor configured to receive the current ($I_{cell}$), to store a charge in dependence on the received current ($I_{cell}$) and to provide a detected voltage ($V_c$), resulting from the stored charge, to a detector circuit that triggers storing of the count value received from the global counter.

Further, a method for sensing currents on bits lines of an array of memory cells including a plurality of bit lines and a plurality of word lines and providing digital outputs is provided. The method can include sensing a difference, using sensing circuits, between first and second currents on respective bit lines in selected bit lines, continuously receiving, by the sensing circuits, a count value provided from a global counter in dependence on a clock signal, and producing, by the sensing circuits, the digital outputs for the selected bit lines as a function of the difference and the count value, wherein a digital output is produced by each sensing circuit, of the sensing circuits, in dependence on (i) the difference between the first and second currents and (ii) a stored count value received from the global counter, the count value being stored in dependence on a value of the difference between the first and second currents.

Additionally, a circuit is provided to include sensing circuits configured to sense a difference between first and second currents on respective bit lines, of an array of memory cells, in selected bit lines and to produce outputs for the selected bit lines as a function of the difference, and wherein each sensing circuit, of the sensing circuits, produces an output in dependence on (i) the difference between the first and second currents and (ii) a stored count value received from a global counter configured to continuously provide a count value to each of the sensing circuits in dependence on a clock signal, the count value being stored in dependence on a value of the difference between the first and second currents.

Other aspects and advantages of the present invention can be seen on review of the drawings, the detailed description and the claims, which follow.

DETAILED DESCRIPTION

A detailed description of embodiments of the technology disclosed is provided with reference to the FIGS. 1-5.

Figure 1:
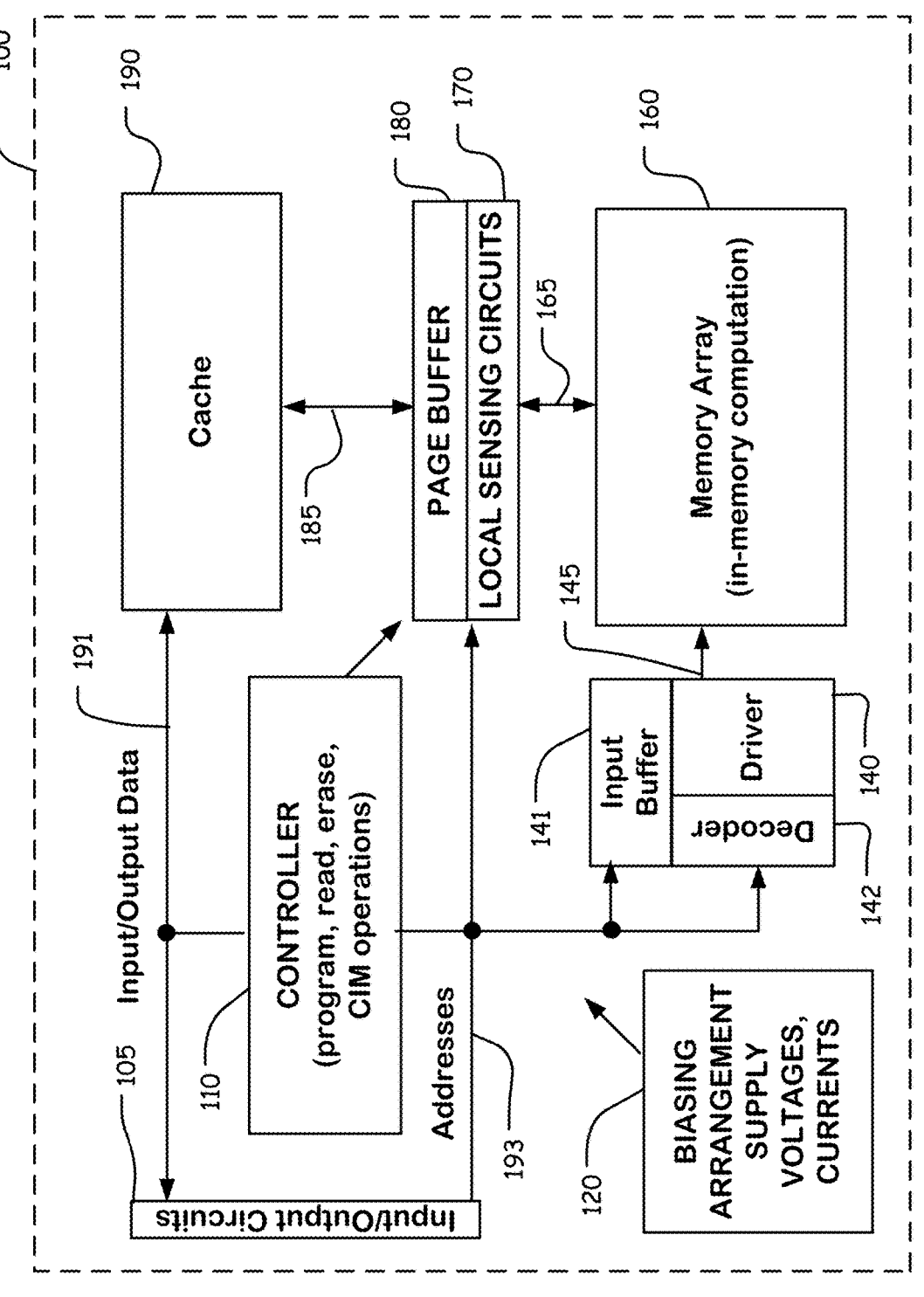
FIG. 1 is a simplified block diagram of an integrated circuit device including a memory array arranged for in-memory computing with, for example, signed inputs and weights, according to embodiments of the present disclosure.

FIG. 1 is a simplified block diagram of an integrated circuit device including a memory array arranged for in-memory computation with, for example, signed inputs and weights, according to embodiments of the present disclosure.

Specifically, FIG. 1 is a simplified block diagram of an integrated circuit device 100 including a memory array 160 arranged for in-memory computation for compute in memory (CIM) operations, such as, for example, a signed, sum-of-products operation. The integrated circuit device 100 can be implemented on a single chip, or on a multichip module.

The device 100 includes input/output circuits 105 for communication of control signals, data, addresses and commands with other data processing resources, such as a central processing unit (CPU) or a memory controller.

Input/output data is applied on bus 191 to a controller 110, and to cache 190. Also, addresses are applied on bus 193 to a decoder 142, and to the controller 110. Also, the bus 191 and bus 193 can be operably connected to data sources internal to the integrated circuit device 100, such as a general purpose processor or special purpose application circuitry, or a combination of modules providing for example, system-on-a-chip functionality.

The memory array 160 can include an array of memory cells in a NOR architecture or in an AND architecture, such that memory cells are arranged in columns along bit lines and in rows along word lines, and the memory cells in a given column are connected in parallel between a bit line and a source reference. The source reference can comprise a ground terminal or a source line connected to source side biasing resources. The memory cells can comprise charge trapping transistors cells, arranged in a 3D structure.

The bit lines can be connected by block select circuits to global bit lines 165, configured for selectable connection to a page buffer 180, and to local sensing circuits 170 (e.g., CIM sensing circuits).

The page buffer 180 in the illustrated embodiment is connected by bus 185 to the cache 190. The page buffer 180 can include storage elements and further sensing circuits for memory operations, including read and write operations. For flash memory including dielectric charge trapping memory and floating gate charge trapping memory, write operations include program and erase operations.

A driver circuit 140 is coupled to word lines 145 in the memory array 160, and applies word line voltages to selected word lines in response to a decoder 142 which decodes addresses on bus/line 193, or in a computation operation, in response to input data stored in input buffer 141.

The controller 110 is coupled to the cache 190 and the memory array 160, and to other peripheral circuits used in memory access and in CIM operations.

Controller 110, using a for example a state machine, controls the application of supply voltages and currents generated or provided through the voltage supply or current sources in block 120, for memory operations and for CIM operations.

The controller 110 includes control and status registers, and control logic which can be implemented using special-purpose logic circuitry including state machines and combinational logic as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 160 includes memory cells arranged in columns and rows, where memory cells in columns are connected to corresponding bit lines, and memory cells in rows are connected to corresponding word lines. For CIM operations, the memory array 160 can be programmable to store signed coefficients (weights Wi) in sets of memory cells.

In a CIM mode, the word line driver circuit 140 includes drivers configured to drive signed inputs Xi by a select mode of voltages on selected word lines and unselected word lines from the input buffer 141. The local sensing circuits 170 can be configured to sense a difference between first and second currents on respective bit lines in selected pairs of bit lines (and/or a single bit line) and to produce outputs for the selected pairs of bit lines (and/or the single bit line) as a function of the difference. The sensing of the difference can include subtracting current or voltage values from respective bit lines and can include adding current or voltage values from respective bit lines. The outputs can be applied to storage elements in the page buffer 180 and to the cache 190.

An implementation of a memory array 160 can be based on charge trapping memory cells, such as floating gate memory cells which can include polysilicon charge trapping layers, or dielectric charge trapping memory cells which can include silicon nitride charge trapping layers. Other types of memory technology can be applied in various embodiments of the technology described herein.

Figure 2:
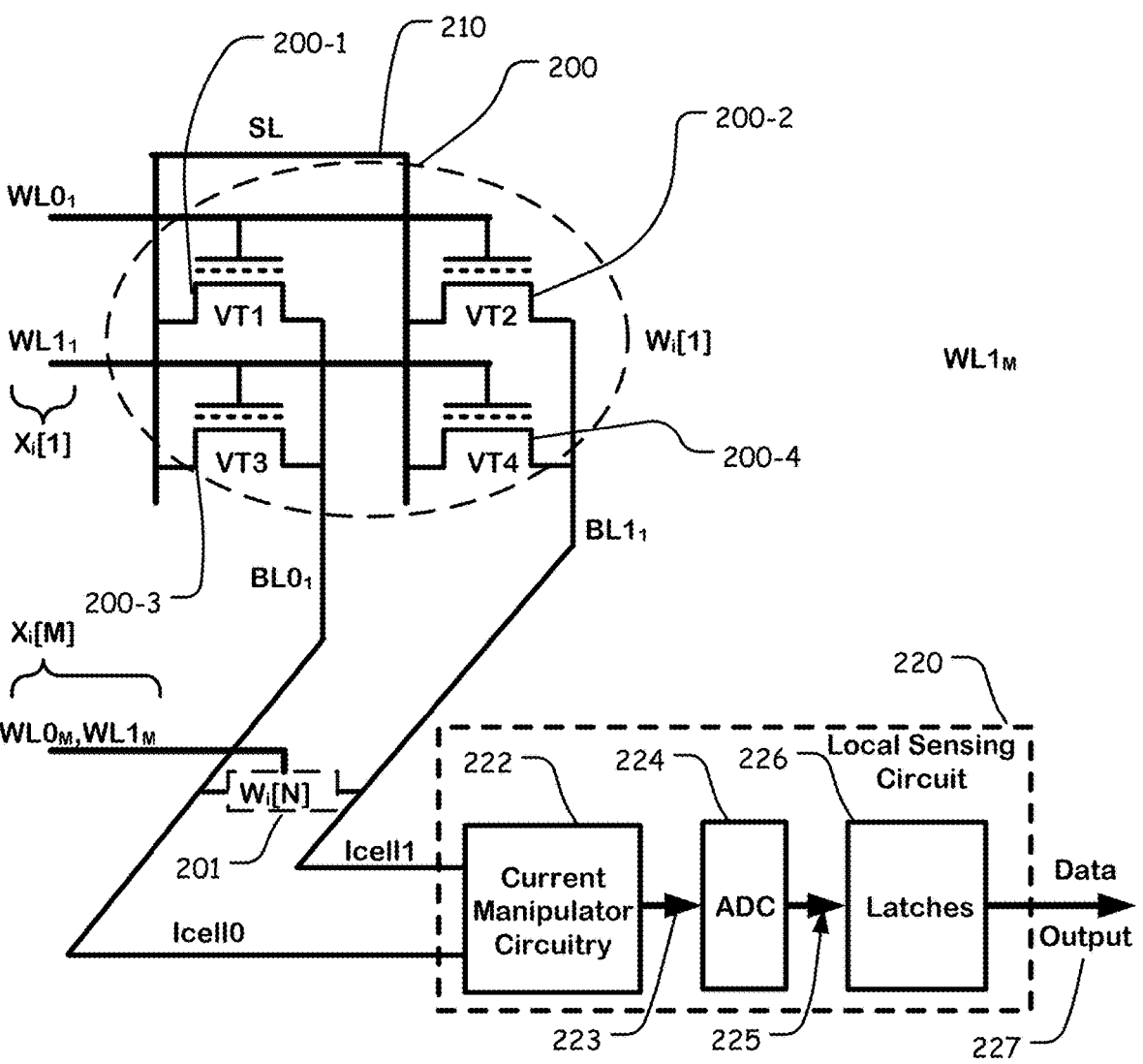
FIG. 2 is a schematic diagram of a set of memory cells and a local sensing circuit arranged for storing and outputting data for in-memory computation, according to embodiments of the present disclosure.

FIG. 2 is a schematic diagram of a set of memory cells and a local sensing circuit arranged for storing and outputting data for in-memory computation, according to embodiments of the present disclosure.

Specifically, FIG. 2 represents a set of memory cells 200, implemented in this example by charge trapping memory transistors, configured to store a bit (e.g., a signed or unsigned bit). The set of memory cells 200 in FIG. 2 can be one of many sets of memory cells used to store many bits in a memory array having a plurality of word lines and a plurality of bit lines. For example, many sets of memory cells 200 like that of FIG. 2 can be used to store a vector of M coefficients Wi (or weights), for i from 1 to M, applied in a sum-of-products operation, or many arrays of coefficients for efficient CIM operations. These are only examples of CIM operations and the technology disclosed herein can be implemented in any type of in-memory compute device as well as other types of memory devices.

The set of memory cells 200 in FIG. 2 includes a first memory cell 200-1, a second memory cell 200-2, a third memory cell 200-3 and a fourth memory cell 200-4. Each of the first, second, third and fourth memory cells 200-1, 200-2, 200-3, 200-4 can be implemented by a charge trapping memory transistor. Other implementations will be apparent to those skilled in the art. For the purposes of notation, the set of memory cells 200 can be referred to as storing a signed bit for a coefficient $W_1$ in a vector Wi. Other implementations for CIM operations will be apparent to those skilled in the art.

The first memory cell 200-1 is on a first bit line $BL0_1$ and a first word line $WL0_1$. The second memory cell 200-2 is on a second bit line $BL1_1$ and the first word line $WL0_1$. The third memory cell 200-3 is on the first bit line $BL0_1$ and a second word line $WL1_1$. The fourth memory cell 200-4 is on the second bit line $BL1_1$ and the second word line $WL1_1$. Source sides (source line or SL sides) of the first, second, third and fourth memory cells 200-1 to 200-4 can be connected to a source reference circuit, which can comprise a ground terminal or a source line (SL) connected to source side biasing resources operable for memory operations such as program and erase. In the illustrated example, the source reference circuit includes a common source line (SL) 210 connected to source side biasing circuits (not shown).

Another set of memory cells 201, is identical in form and structure to that of the set of memory cells 200, but for clarity is illustrated with fewer details. Each of the sets of memory cells 200 and 201 are usable to store a weight value, $W_i[1]$ and $W_i[N]$ respectively. Each of the sets of memory cells 200 and 201 are enabled to receive a respective variable value, $X_i[1]$ and $X_i[M]$ respectively. Each of the variable values is provided by a pair of word lines, $WL0_1$ and $WL1_1$ for $X_i[1]$ and $WL0_M$ and $WL1_M$ for $X_i[M]$. Each of the sets of memory cells 200 and 201 is enabled to perform an arithmetic operation using the stored weight value and the provided variable value, e.g., multiplication ($X_i[1]*W_i[1]$) and to provide results of the operation as currents reflected as portions of Icell0 and Icell1.

Any suitable encoding is usable for encoding a weight value using threshold values (VT1, VT2, VT3, and VT4) respectively on memory cells 200-1, 200-2, 200-3, and 200-4. Any suitable encoding is usable for encoding a variable value using a particular voltage pair on $WL0_1$ and $WL1_1$. Encoding of weight value and variable value is identical for the set of memory cells 201. The set of memory cells 201 is representative of one or more such cells similarly connected in parallel to bit lines $BL0_1$ and $BL1_1$.

Use of VT1, VT2, VT3, and VT4 as well as currents and/or voltages on the first bit line $BL0_1$, the second bit line $BL1_1$, the first word line $WL0_1$ and the second word line $WL1_1$ for performing CIM operations will be apparent to those skilled in the art.

As illustrated in FIG. 2, the pair of bit lines $BL0_1$ and $BL1_1$ is connected to a local sensing circuit 220. Bit line $BL0_1$ can provide current $I_{cell0}$ to the local sensing circuit 220 and bit line $BL1_1$ can provide current $I_{cell1}$ to the local sensing circuit 220. Further, the currents $I_{cell0}$ and $I_{cell1}$ can be provided and/or detected on a same bit line, such as $BL0_1$ or $BL1_1$. This holds true for all descriptions of providing and/or detecting currents on bit lines described herein.

Further, the local sensing circuit 220 can include current manipulator circuitry 222 that provides an analog output 223 (current or voltage) based on the values of the current $I_{cell0}$ and the current $I_{cell1}$. For example, the current manipulator circuitry 222 can be a circuit that generates a difference in (or an addition of) the current $I_{cell0}$ and the current $I_{cell1}$, as the analog output 223. The local sensing circuit 220 can also include an analog-to-digital converter (ADC) 224 that converts that analog output 223 to a digital output 225 that is stored in a memory, such as latches 226 of the local sensing circuit 220, which can then provide a data output 227.

In-memory compute devices require thousands of local sensing circuits (e.g., local sensing circuits 170 of FIG. 1) and the use of an analog-to-digital converter, such as ADC 224, consumes an undesirable amount of power (e.g., reduces efficiency) and occupies an undesirable amount of physical space, which can reduce an amount of CIM operations that can be carried out in a space of a specific size or that can be carried out given power consumption restrictions.

Figure 3:
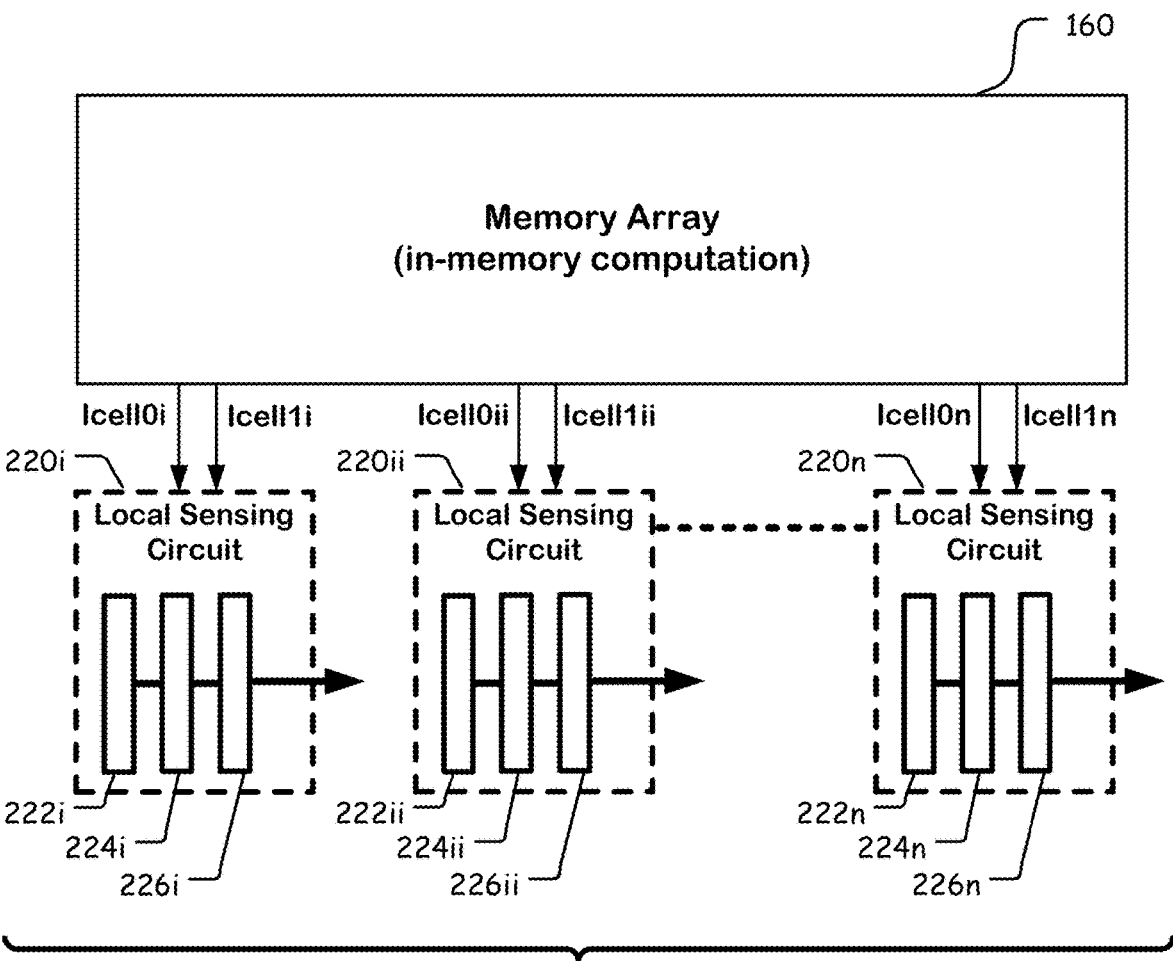
FIG. 3 is a schematic diagram of a memory array used for in-memory computation and thousands of local sensing circuits having local analog-to-digital converters, according to embodiments of the present disclosure.

For example, FIG. 3 is a schematic diagram of the memory array 160 used for in-memory computation and the thousands of local sensing circuits having local analog-to-digital converters, according to embodiments of the present disclosure, that consume an undesirable amount of power and that occupy an undesirable amount of space.

Specifically, FIG. 3 illustrates local sensing circuit 220i, local sensing circuit 220ii to local sensing circuit 220n, where n can be an integer up to hundreds of thousands or even more. Similar to FIG. 2, FIG. 3 illustrates that (i) local sensing circuit 220i includes current manipulator circuitry 222i, an ADC 224i and latches 226i that provide a data output, (ii) local sensing circuit 220ii includes current manipulator circuitry 222ii, an ADC 224ii and latches 226ii that provide a data output and (iii) local sensing circuit 220n includes current manipulator circuitry 222n, an ADC 224n and latches 226n that provide a data output. The ADCs 224i to 224n can be one of the largest physical components and one of the highest power consuming resources of the local sensing circuits 220i to 220n. Accordingly, it is desirable to implement local sensing circuits that do not require individual ADCs for the reasons discussed herein.

Figure 4:
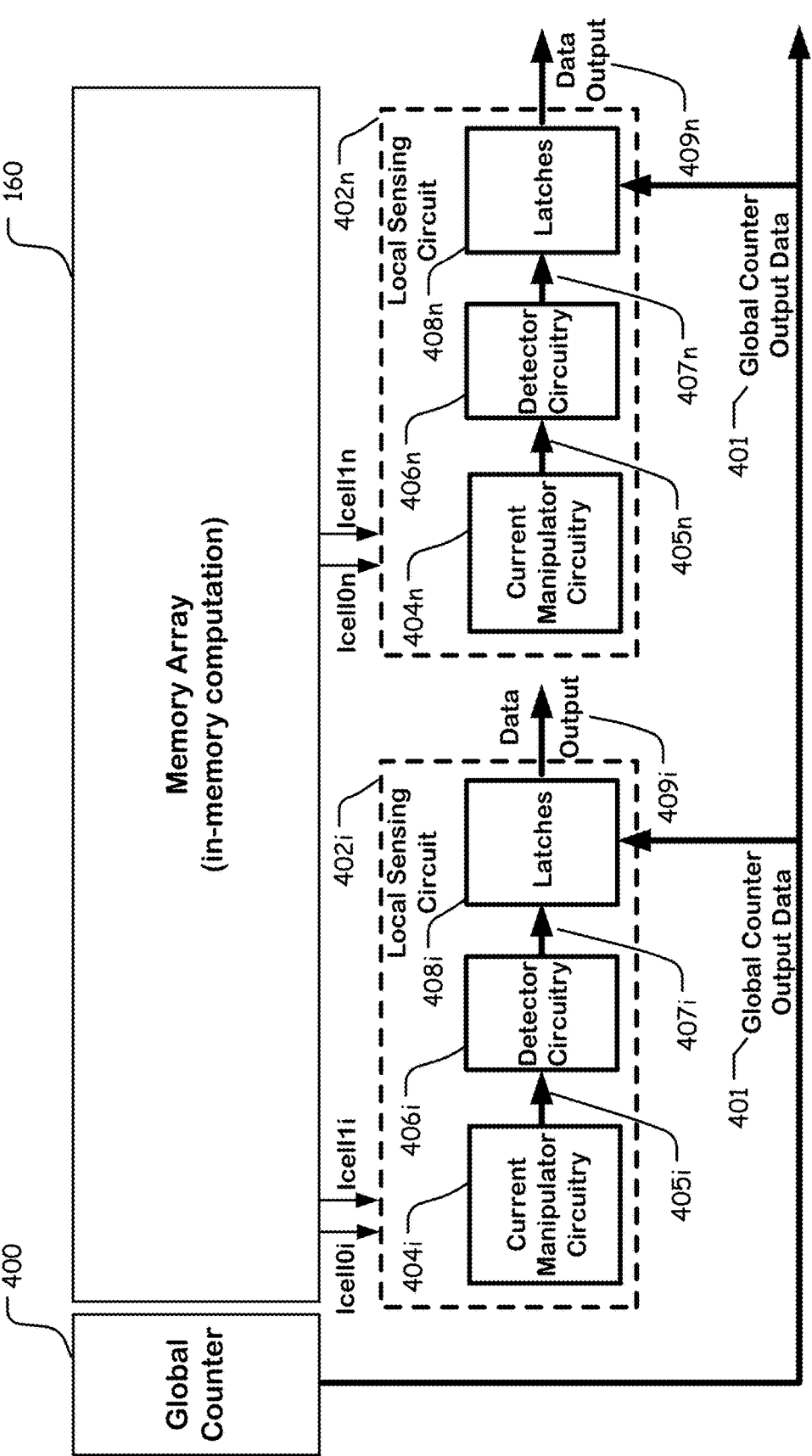
FIG. 4 is a schematic diagram of a memory array used for in-memory computation, having local sensing circuits without local analog-to-digital converters and including a global counter that is utilized by each of the local sensing circuits, according to embodiments of the present disclosure.

FIG. 4 is a schematic diagram of a memory array used for in-memory computation, having local sensing circuits without local analog-to-digital converters and including a global counter that is utilized by each of the local sensing circuits, according to embodiments of the present disclosure.

Specifically, as illustrated, a global counter 400 provides global counter output data 401, which can be referred to as a count value, to local sensing circuits 402i through 402n, where n can be an integer up to hundreds of thousands or even more. Similar to the local sensing circuit 220 of FIG. 2, the local sensing circuit 402i includes (local) current manipulator circuitry 404i (e.g., a local current manipulator circuit) that provides an output 405i, such as an analog output, to (local) detector circuitry 406i (e.g., a local detector circuit). The current manipulator circuitry 404i can operate in the same manner as the current manipulator circuitry 222 of FIG. 2. For example, the local sensing circuit 402i can receive current $I_{cell0i}$ and current $I_{cell1i}$ from a pair of bit lines (or a single bit line) of the memory array 160 and can sense a difference between the currents $I_{cell0i}$ and $I_{cell1i}$. The difference between the currents $I_{cell0i}$ and $I_{cell1i}$ can be reflected as a subtraction of one current from another current or an addition of one current to another current. The current manipulator circuitry 404i can then provide the output 405i as a function of the sensed or detected difference.

The detector circuitry 406i receives the output 405i and can compare the output 405i to another known value, such as a reference voltage $V_{ref}$. Once the detector circuitry 406i determines that the output 405i has reached, exceeded and/or fell below the other known value, the detector circuitry 406i can provide an output 407i, such as a trigger signal, to (local) latches 408i that triggers the storage of the global counter output data 401. Although FIG. 4 illustrates the local sensing circuit 402i as including latches 408i, other storage components, such as flip-flops can replace the latches 408i to store the global counter output data 401. The data stored in the latches 408i can be provided as data output 409i resulting from a CIM operation.

By replacing the ADC 224 of FIG. 2 with the detector circuitry 406i and the global counter 400 that provides the global counter output data 401, the power consumption and the size of the in-memory compute device can be greatly reduced and/or the performance of the in-memory compute device can be greatly increased.

As illustrated, there can be n number of local sensing circuits. Specifically, FIG. 4 illustrates local sensing circuit 402n that receives current $I_{cell0n}$ and current $I_{cell1n}$ from a pair of bit lines (or a single bit line) of the memory array 160, wherein the local sensing circuit 402n includes current manipulator circuitry 404n that provides an output 405n to detector circuitry 406n that provides an output 407n to be stored by latches 408n that can provide data output 409n of, for example, a CIM operation.

The global counter 400 can continuously provide the global counter output data 401 as a count value 401. As illustrated, the same count value 401 is received by each of the local sensing circuits 402i to 402n (e.g., each of the sensing circuits 402i to 402n can operate according to the same global counter 400 and the count value 401 provided thereby). Specifically, the count value 401 is received by respective latches 408i to 408n, which can be triggered to respectively store the count value 401, as triggered by respective trigger signals 407i to 407n. The latches 408i to 408n can be any type of component that can store or latch data. Further, the global counter 400 can be any kind of counter, such as a regular counter that increments or decrements count values a regular intervals, a non-regular counter that increments or decrements count values at non-regular intervals, a bit number counter that counts a number of received bits and increments or decrement count values accordingly over time, etc.

The global counter 400 can provide the count value 401 in the form of a binary value, or otherwise. For example, the count value 401 can be a 2-bit, a 3-bit, a 4-bit, a 5-bit, etc. value that is received by the latches 408i to 408n. The latches 408i to 408n will have, for example, at least the same number of storage locations as the number of bits of the count value 401 so that the entire count value 401 received from the global counter 400 can be stored. As the global counter 400 continues to provide the count value 401 to the latches 408i to 408n, the count value 401 (e.g., a particular count value) can be stored (latched) at different times by the latches 408i to 408n as they are triggered respectively by the trigger signals 407i to 407n at different times. The count value 401 that is stored by the different latches 408i to 408n is then provided at the data output 409i to 409n of the local sensing circuits 402i to 402n.

More details regarding the specific structure and operation of the local sensing circuits 402i to 402n is provided below with reference to FIG. 5.

Figure 5:
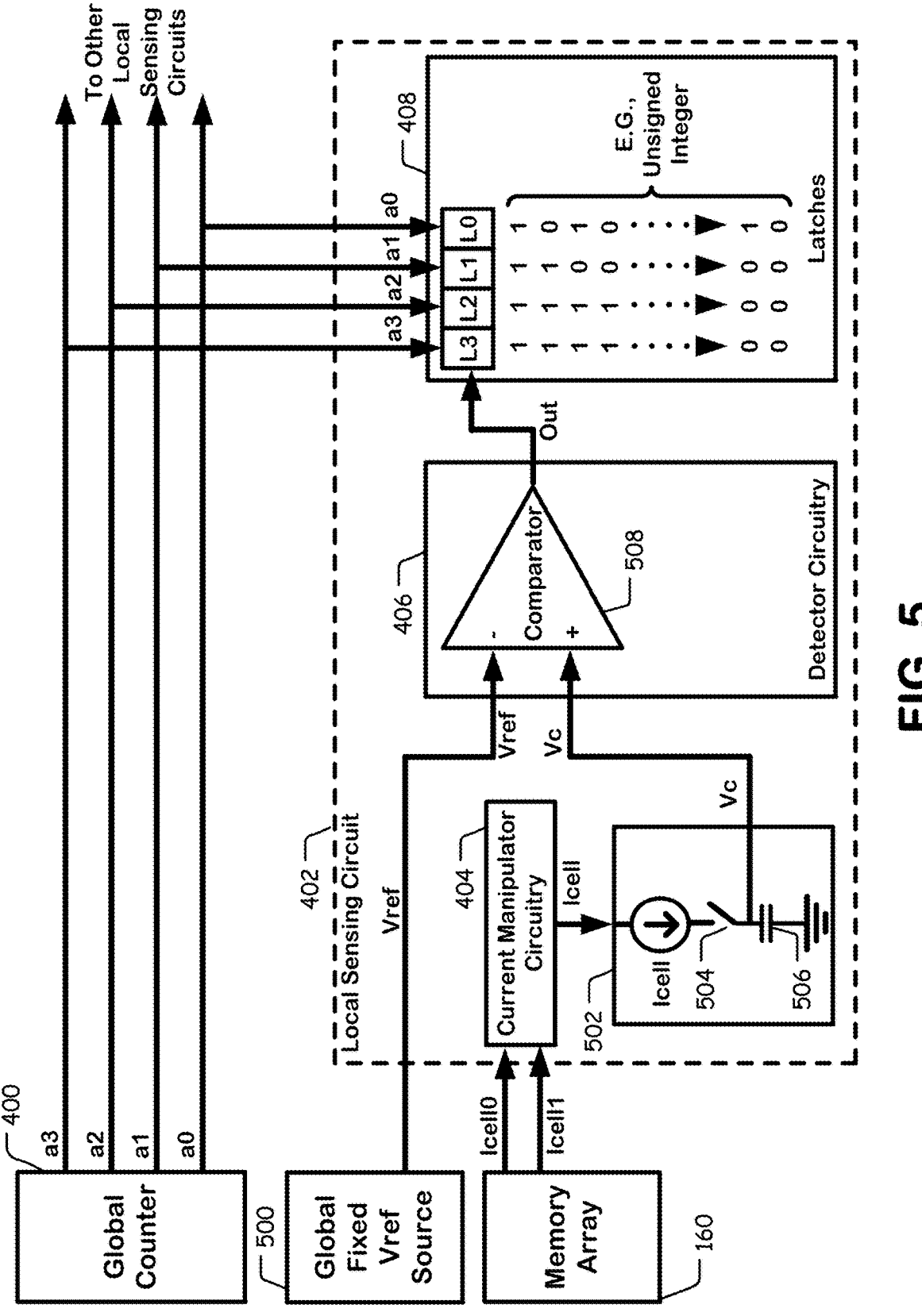
FIG. 5 is a more detailed schematic diagram of a local sensing circuit used for in-memory computation, according to embodiments of the present disclosure.

FIG. 5 is a more detailed schematic diagram of a local sensing circuit used for in-memory computation, according to embodiments of the present disclosure. As discussed with reference to FIG. 4, the in-memory compute device can include thousands of local sensing circuits. FIG. 5 illustrates the structure of just one of the local sensing circuits, but all local sensing circuits of the in-memory compute device can have the same structure as discussed here with reference to FIG. 5.

Specifically, FIG. 5 illustrates more details regarding the output of the global counter 400 and the circuit structure of the local sensing circuit 402. The global counter 400 can output 4 bits as the count value. For example, the global counter 400 can output bit a0, bit a1, bit a2 and bit a3 as a four-bit value. The latches 408 of the local sensing circuit 402 can include four latches, including latch L0, latch L1, latch L2 and latch L3. As illustrated, latch L0 can receive the bit value a0, as provided by the global counter 400, latch L1 can receive the bit value a1, as provided by the global counter 400, latch L2 can receive the bit value a2, as provided by the global counter 400 and latch L3 can receive the bit value a3, as provided by the global counter 400. The number of bits provided by the global counter 400 and the number of latches included in latches 408 is just an example. The technology disclosed herein may utilize any number of bits and latches. Optionally, there is at least one latch included in the latches 408. The number of latches included in the latches 408 should at least equal the number of bits provided as the count value from the global counter 400.

As illustrated in FIG. 5, the binary value represented by bits a0, a1, a2 and a3 increments (counts) between 0 and 15 (e.g., binary value 0000, 0001, 0010, 0011, 0100, 0101, 0110, 0111, 1000, 1001, 1010, 1011, 1100, 1101, 1110 and 1111) as unsigned integers. FIG. 5 illustrates counting from 0 to 15 continuously incrementing by one integer over time. This is just an example, as discussed herein, such that the counter can count forwards and/or backwards, count in regular or non-regular number patterns and count according to regular or non-regular clock cycles. The global counter 400 can operate based on a clock, such as a high speed clock, or some other mechanism that would be apparent to a person skilled in the art. A value output from the detector circuitry 406 can trigger the latches 408 to store a current count value provided by the global counter 400.

Additionally, as illustrated in FIG. 5, the local sensing circuit 402 includes (local) charge-up circuitry 502 that receives the current $I_{cell}$ as provided by the current manipulator circuitry 404 (as described above with respect to FIGS. 2 and 4). Specifically, the current $I_{cell}$ is received as a current source to the charge-up circuitry 502. The charge-up circuitry 502 can further include an optional switch 504 and the one or more capacitors 506. Further, there can be multiple switches 504. For example, there can be one or more switches 504 for each capacitor of the one or more capacitors 506. The term "the switch 504" can encompass one more switches 504. The switch 504 can be used to allow the one or more capacitors 506 to completely discharge and/or prevent the one or more capacitors 506 from further charging. Further, one or more additional switches, within the charge-up circuitry 502, can be used to connect $V_c$ to GND to discharge the one or more capacitors 506 and connect $I_{cell}$ to GND. For example, synchronized with the global counter 400, the switch 504 is used to discharge the one or more capacitors 506 before counting begins. For another example, the switch 504 is used to enable charging of the one or more capacitors 506 by the current $I_{cell}$, such as in conjunction with making a comparison with the detected voltage $V_c$. For another example, the switch 504 is used to disconnect the current $I_{cell}$ from further charging of the one or more capacitors 506 in conjunction with making a comparison with the detected voltage $V_c$. For another example, the switch 504 is used to discharge any stored charge in the one or more capacitors 506 in preparation for a measurement of the current $I_{cell}$. Then the switch 504 is used to enable the current $I_{cell}$ to charge the one or more capacitors 506 for a particular amount of time, e.g., the switch 504 is closed at the beginning of the particular amount of time and then opened at the end of the particular amount of time. Thus, the detected voltage $V_c$ will attain a value proportional to the current $I_{cell}$, the capacitance value of the one or more capacitors 506, and the particular amount of time. The one or more capacitors 506 can range in values. An example capacitor can be 50 fF. As the one or more capacitors 506 receive the current $I_{cell}$, they begin to charge up and can provide a voltage $V_c$ (e.g., a detected voltage $V_c$) that can be detected by the detector circuitry 406. Over time, as the one or more capacitors 506 charge up from the current $I_{cell}$, the value of the detected voltage $V_c$ will increase.

The in-memory compute device also includes a global fixed $V_{ref}$ source 500 that provides a reference voltage $V_{ref}$ to the detector circuitry 406. The reference voltage $V_{ref}$ can be any voltage available to the in-memory compute device. An example value of the reference voltage $V_{ref}$ is 0.6 volts. The global fixed $V_{ref}$ source 500 can provide the reference voltage $V_{ref}$ to all of the sensing circuits of the in-memory compute device. Alternatively, a global adjustable $V_{ref}$ source can be implemented that adjusts a value of the reference voltage $V_{ref}$ according to various factors. The detector circuitry 406 can compare the value of the reference voltage $V_{ref}$ to a value of the detected voltage $V_c$. This comparison can be done using a comparator 508. Any other type of circuitry can be implemented to make the comparison between the value of the reference voltage $V_{ref}$ and the value of the detected voltage $V_c$. For example, the comparator 508 can be replaced by one or more differential amplifiers and/or one or more inverters. With the structure of detector circuitry 406 and the comparator 508 illustrated in FIG. 5, the comparator 508 can provide a low output (e.g., 0) when the detected voltage $V_c$ is less than the reference voltage $V_{ref}$ and the comparator 508 can provide a high output (e.g., 1) when the detected voltage $V_c$ is more than the reference voltage $V_{ref}$. Other types of logic can be implemented by the detector circuitry 406, and this illustration is only an example.

In this example, initially while the reference voltage $V_{ref}$ is higher than the detected voltage $V_c$, the comparator 508 will output a value of 0, such that the latches 408 are not triggered to latch (store) the count value 401 (as provided by bits a0 to a3). Over time, as the current $I_{cell}$ charges the one or more capacitors 506, the detected voltage $V_c$ will sufficiently increase such that the detected voltage $V_c$ reaches or exceeds the value of the reference voltage $V_{ref}$ and the comparator 508 will output a value of 1 which will trigger the latches 408 to latch (store) the count value 401 (as provided by bits a0 to a3). The output of the detector circuitry 406 and/or the comparator 508 can be referred to as a trigger signal (that triggers the latches 408 to latch/store the count value 401). The trigger signal can change from a value of 0 to 1 or change from a value of 1 to 0 as a result of the detected voltage $V_c$ reaching or exceeding (or dropping/falling below) a value of the reference voltage $V_{ref}$. The detector circuitry 406 can include a multiple comparator configuration. The comparator 508 can be configured to be edge triggered or level triggered or can have other configurations known to those skilled in the art.

Although FIG. 5 illustrates the current manipulator circuitry 404, the charge-up circuitry 502, the detector circuitry 406 and the latches 408 as being local to the local sensing circuit 402, other configurations are possible such that each of the current manipulator circuitry 404, the charge-up circuitry 502, the detector circuitry 406 and the latches 408 is not necessarily local to the local sensing circuit 402. Further, alternatively, a current or voltage generated from the current $I_{cell}$ can be provided to the detector circuitry 406 as the detected voltage $V_c$ (or just as a detected current) without the use of the charge-up circuitry 502 and/or the one or more capacitors 506. For example, the detector circuitry 406 can directly detect the current $I_{cell}$ as provided by the current manipulator circuitry 404 or the detector circuitry 406 can detect the current $I_{cell0}$ and/or $I_{cell1}$ as provided by the memory array 160. Furthermore, rather than providing the reference voltage $V_{ref}$ to the detector circuitry 406, a reference current $I_{ref}$ can be provided to the detector circuitry 406 for comparison to the current $I_{cell}$, the current $I_{cell0}$ and/or the current $I_{cell1}$.

The technology disclosed herein is not just limited to in-memory compute devices, but can be used for sensing in any type of memory cells in which different cell currents can represent different data values. Moreover, the technology disclosed herein is not just limited to sensing currents in memory devices and can be implemented in any device that senses current. In view of these additional configurations, the detector circuitry 406 can be any type of detector that can detect current and/or voltage. For example, the detector circuitry 406 can detect cell current from a memory cell, mirrored current and/or current from a charged-up voltage in a capacitor. The technology disclosed, such as the sensing circuits, can be implemented in a system process control block (PCB) and do not necessarily need to be implemented inside a memory chip or an in-memory compute device.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

A number of flowcharts illustrating logic executed by a memory controller or by memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit, comprising:
an array of memory cells including a plurality of bit lines and a plurality of word lines;
sensing circuits configured to sense a difference between first and second currents on respective bit lines in selected bit lines and to produce outputs for the selected bit lines as a function of the difference; and
a global counter configured to continuously provide a count value to each of the sensing circuits in dependence on a clock signal,
wherein each sensing circuit, of the sensing circuits, produces an output, of the outputs, in dependence on (i) the difference between the first and second currents and (ii) a stored count value received from the global counter, the count value being stored in dependence on a value of the difference between the first and second currents.

2. The circuit of claim 1,
wherein the global counter is configured to continuously increment or decrement the count value over time, and
wherein, for a particular time, a same particular count value is provided to each of the sensing circuits.

3. The circuit of claim 1, wherein each sensing circuit, of the sensing circuits, includes a local detector circuit configured to:
receive a detected voltage ($V_c$) generated in dependence on the difference;
receive a reference voltage ($V_{ref}$); and
generate a trigger signal in dependence on the detected voltage ($V_c$) and the reference voltage ($V_{ref}$).

4. The circuit of claim 3,
wherein each sensing circuit, of the sensing circuits, includes a storage configured to store a particular count value provided by the global counter, and
wherein the storing of the particular count value is performed in dependence on the trigger signal.

5. The circuit of claim 4, wherein the storage includes latches that store the particular count value provided by the global counter.

6. The circuit of claim 4, wherein the storage includes flip-flops that store the particular count value provided by the global counter.

7. The circuit of claim 4, wherein the local detector circuit includes a comparator configured to (i) compare the detected voltage ($V_c$) and the reference voltage ($V_{ref}$) and (ii) generate the trigger signal as a result of the detected voltage ($V_c$) reaching, exceeding or falling below the reference voltage ($V_{ref}$).

8. The circuit of claim 7, wherein the trigger signal generated by the comparator is edge triggered as the result of the detected voltage ($V_c$) reaching, exceeding or falling below the reference voltage ($V_{ref}$).

9. The circuit of claim 7, wherein the trigger signal generated by the comparator is level triggered as the result of the detected voltage ($V_c$) reaching or exceeding the reference voltage ($V_{ref}$).

10. The circuit of claim 3, wherein the local detector circuit includes a differential amplifier configured to generate the trigger signal in dependence on the detected voltage ($V_c$) and the reference voltage ($V_{ref}$).

11. The circuit of claim 3, wherein the local detector circuit includes an inverter configured to generate the trigger signal in dependence on the detected voltage ($V_c$) and the reference voltage ($V_{ref}$).

12. The circuit of claim 3, wherein the reference voltage ($V_{ref}$) is received by each sensing circuit, of the sensing circuits, from a global fixed reference voltage source, such that each sensing circuit receives the same reference voltage ($V_{ref}$).

13. The circuit of claim 3, wherein the reference voltage ($V_{ref}$) is received by each sensing circuit, of the sensing circuits, from a global adjustable reference voltage source, such that each sensing circuit receives the same reference voltage ($V_{ref}$).

14. The circuit of claim 3, wherein each sensing circuit, of the sensing circuits, operates according to the same global counter and the local detector circuit, as opposed to implementing a local analog-to-digital converter.

15. The circuit of claim 1, wherein each sensing circuit, of the sensing circuits, does not include a local analog-to-digital converter.

16. The circuit of claim 1, wherein the count value provided by the global counter is a binary value of at least two bits.

17. The circuit of claim 1, wherein the global counter is one of a regular counter and a non-regular counter.

18. The circuit of claim 1, wherein each sensing circuit, of the sensing circuits, includes:

a current manipulator circuit configured to sense a difference between a first sensed current ($I_0$) and a second sensed current ($I_1$) and to output a current ($I_{cell}$); and a capacitor configured to receive the current ($I_{cell}$), to store a charge in dependence on the received current ($I_{cell}$) and to provide a detected voltage ($V_c$), resulting from the stored charge, to a detector circuit that triggers storing of the count value received from the global counter.

19. A method for sensing currents on bits lines of an array of memory cells including a plurality of bit lines and a plurality of word lines and providing digital outputs, the method comprising:

sensing a difference, using sensing circuits, between first and second currents on respective bit lines in selected bit lines;

continuously receiving, by the sensing circuits, a count value provided from a global counter in dependence on a clock signal; and producing, by the sensing circuits, the digital outputs for the selected bit lines as a function of the difference and the count value, wherein a digital output, of the digital outputs, is produced by each sensing circuit, of the sensing circuits, in dependence on (i) the difference between the first and second currents and (ii) a stored count value received from the global counter, the count value being stored in dependence on a value of the difference between the first and second currents.

20. A circuit, comprising:

sensing circuits configured to sense a difference between first and second currents on respective bit lines, of an array of memory cells, in selected bit lines and to produce outputs for the selected bit lines as a function of the difference, and wherein each sensing circuit, of the sensing circuits, produces an output, of the outputs, in dependence on (i) the difference between the first and second currents and (ii) a stored count value received from a global counter configured to continuously provide a count value to each of the sensing circuits in dependence on a clock signal, the count value being stored in dependence on a value of the difference between the first and second currents.

\* \* \* \* \*